United States Patent [19]

Manfredi

[11] 4,284,906
[45] Aug. 18, 1981

[54] CONSTANT AMPLITUDE VARIABLE FREQUENCY SYNCHRONIZED LINEAR RAMP GENERATOR

[75] Inventor: Urbano Manfredi, Maitland, Fla.

[73] Assignee: The United States of America as represented by the Secretary of the Navy, Washington, D.C.

[21] Appl. No.: 81,310

[22] Filed: Oct. 3, 1979

[51] Int. Cl.³ .......................... H03K 5/00; H03K 5/08
[52] U.S. Cl. ................................. 307/228; 307/555; 328/151; 328/181; 307/582
[58] Field of Search ............... 307/229, 237, 251, 238; 328/181–185, 151

[56] References Cited

U.S. PATENT DOCUMENTS

| | | | |
|---|---|---|---|
| 3,373,377 | 3/1968 | Townsend | 307/228 |
| 3,569,735 | 3/1971 | Lavender | 307/228 |
| 3,577,007 | 5/1971 | Cross | 307/228 |
| 4,002,922 | 1/1977 | Spalding | 328/181 |
| 4,225,825 | 9/1980 | Watts | 307/228 |

Primary Examiner—Stanley D. Miller, Jr.
Assistant Examiner—B. P. Davis
Attorney, Agent, or Firm—Richard S. Sciascia; Robert W. Adams; David S. Kalmbaugh

[57] ABSTRACT

A constant amplitude, variable frequency, synchronized, linear ramp generator is disclosed for generating a sawtooth waveform signal, whose amplitude is independent of frequency. A capacitor is charged by a voltage controlled current source, which is responsive to a feedback control signal provided by an integrator; and subsequently discharged by a clamp, which is responsive to a trigger pulse signal, so as to establish a ramp voltage across the capacitor. The ramp voltage, which appears at the output of the linear ramp generator as the sawtooth waveform signal, in turn allows a television system to operate at various line rates.

13 Claims, 3 Drawing Figures

CONSTANT AMPLITUDE VARIABLE FREQUENCY SYNCHRONIZED LINEAR RAMP GENERATOR

BACKGROUND OF THE INVENTION

This invention relates generally to the field of waveform generators. In particular, this invention relates to a waveform generator for producing a constant amplitude sawtooth waveform signal which is independent of frequency.

DESCRIPTION OF THE PRIOR ART

A wide variety of waveform generators are available for the production of sawtooth waveform signals. Such devices of the prior art are useful in many applications, for example for oscilloscope deflection with constant sweep width, an automobile ignition advance and retard indicator using a stroboscopic timing light, or to provide a television system with the capability of operating at a particular line rate. However, with regards to the last of the above mentioned applications, conventional waveform generators only provide television systems with the capability of operating at one particular line rate.

Such conventional waveform generators utilize a capacitor which is charged from a current source and is periodically discharged in a path controlled by an electronic switch. The repetition frequency of the pulses controlling the electronic switch determines the frequency of the resulting sawtooth waveform signal as well as the amplitude of that waveform signal which is proportional to the pulse period.

However, for closed circuit television systems, which operate at various lines or sweep rates, a sawtooth waveform generator is needed to generate a sawtooth waveform signal whose amplitude remains constant with frequency variations.

SUMMARY OF THE INVENTION

The subject invention overcomes some of the disadvantages of the prior art, including those mentioned above, in that it comprises a relatively simple waveform generator for producing a sawtooth waveform signal whose amplitude remains constant over a predetermined frequency range.

The subject invention includes a trigger pulse source means for providing a trigger pulse signal and an inverted trigger pulse signal in response to a sync pulse signal, a capacitor for storing an electric charge supplied by a current source, a clamp for discharging the capacitor in response to the inverted trigger pulse signal, and a pair of track and hold circuits which, when uniquely combined with an integrating means, provide a feedback control signal to control the rate at which the current source charges the capacitor. The voltage across the capacitor, which appears at the output of the subject invention as the sawtooth waveform signal, may be used to operate a television system at various line rates.

DESCRIPTION OF THE PREFERRED EMBODIMENT

Figure 1:
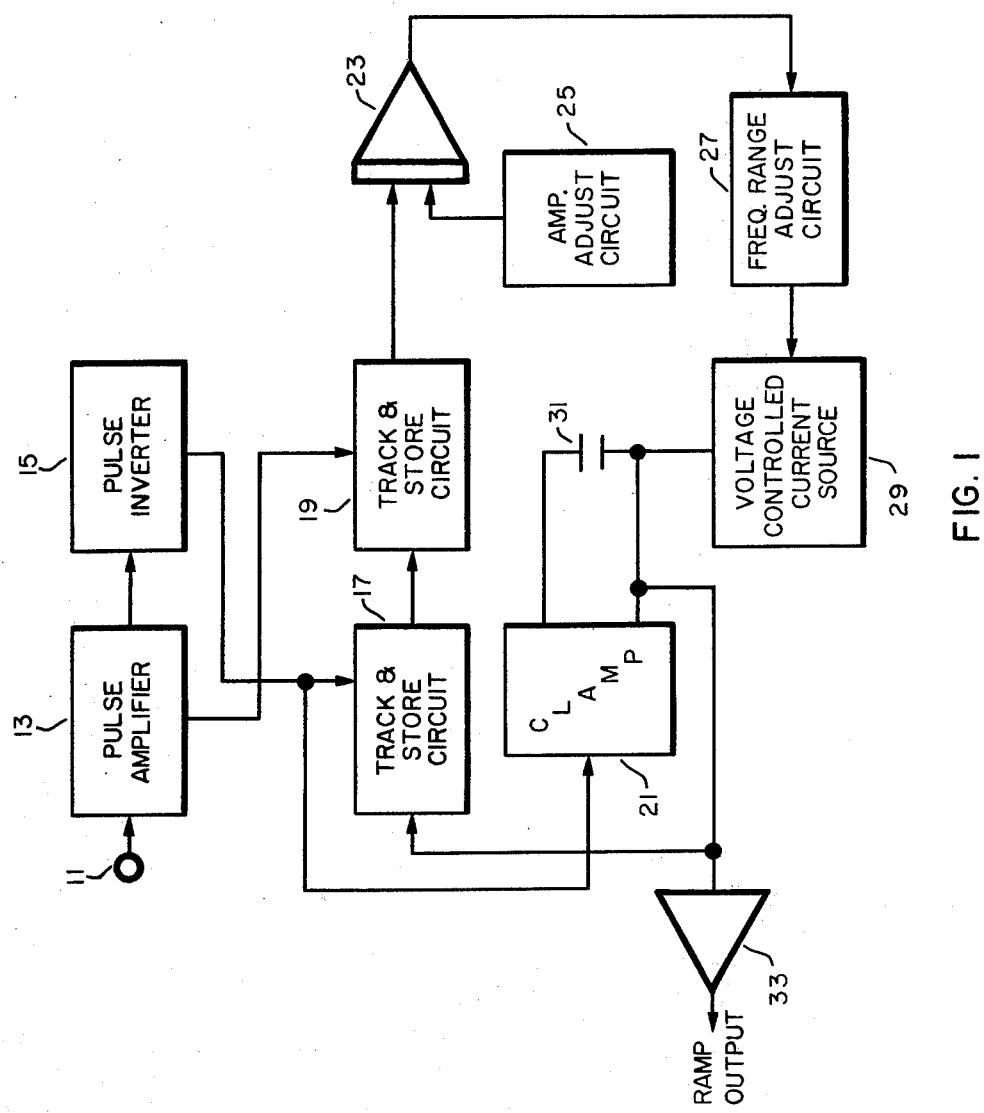
FIG. 1 is a block diagram of a sawtooth waveform generator utilizing the principles of the subject invention.

The preferred embodiment of the subject invention will now be discussed in some detail in conjunction with all of the figures of the drawings, wherein like parts are designated by like reference numerals.

Figure 3:
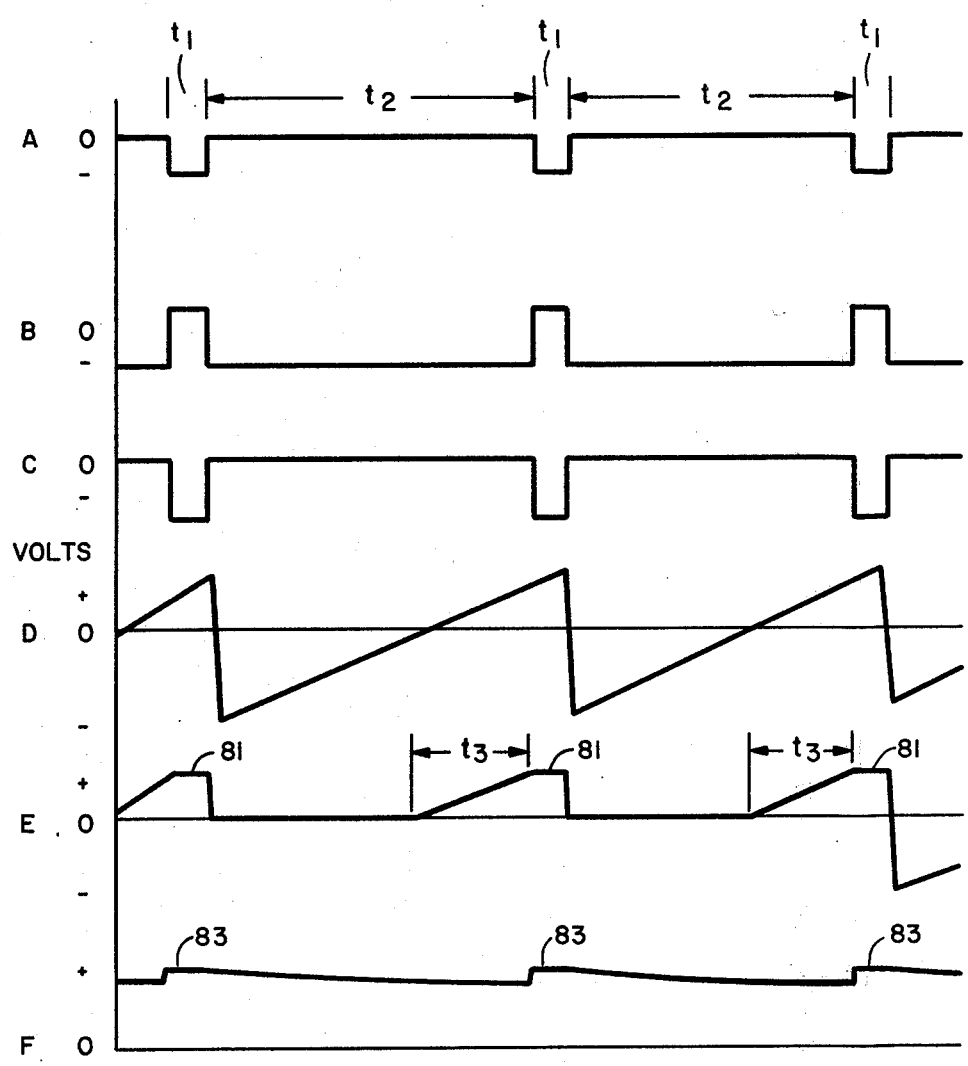
FIG. 3 is a graphical representation of the various pulses which occur at the outputs of some of the elements of FIG. 1.

Referring now to FIG. 1, there is shown an input terminal 11 which is adopted for receiving a sync pulse signal having a plurality of pulses similar to the signal waveform of FIG. 3(A). The sync pulse signal is provided by a source of pulses, not shown, which may be any conventional frequency oscillator used to provide the line or scan rate for a television system. Effectively connected to input terminal 11 is a pulse amplifier 13, the first output of which is connected to the input of a pulse inverter 15 and the second output of which is connected to the second input of a track and store circuit 19. The output of pulse inverter 15 is effectively connected to the first input of a track and store circuit 17 and the input of a clamp 21.

The output of track and store circuit 17 is connected to the first input of track and store circuit 19, the output of which is connected to the first input of an integrator 23. The output of an amplitude adjust circuit 25 is connected to the second input of integrator 23, the output of which is connected to a frequency range adjust circuit 27, with the output thereof connected to the input of a voltage controlled current source 29.

The output of voltage controlled current source 29 is connected to a capacitor 31, the second input of track and store circuit 17, the input of an isolation amplifier 33, and the first of the pair of outputs of clamp 21. The pair of outputs of clamp 21 are effectively connected across capacitor 31.

Figure 2:
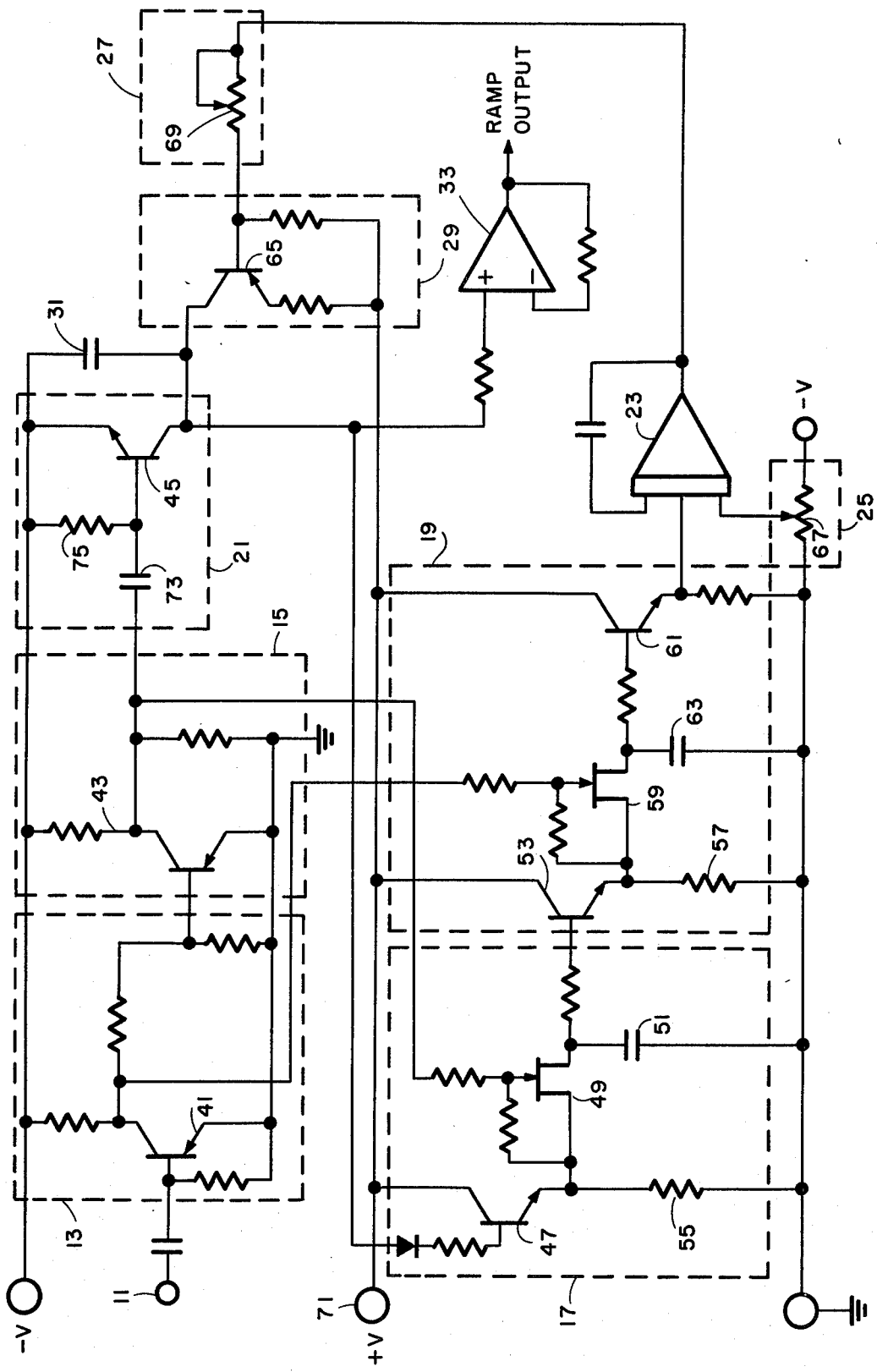
FIG. 2 is an electrical schematic of the generator illustrated in FIG. 1.

Referring now to FIG. 2, there is shown an electrical schematic of the subject invention. For convenience, like numerals are employed to designate similar parts in the block diagram of FIG. 1 and the schematic diagram of FIG. 2.

Pulse amplifier 13 includes a PNP transistor 41 with the base thereof connected to input terminal 11.

Pulse inverter 15 includes a PNP transistor 43, with the base thereof connected to the output of pulse amplifier 13.

Clamp 21 comprises a capacitor 73 effectively connected to the output of pulse inverter 15; an NPN transistor 45, the base of which is connected to capacitor 73; and a resistor 75 effectively connected between the base and the emitter of transistor 45.

Track and store circuit 17 includes an NPN transistor 47, the base of which is connected to the first of the pair of outputs of clamp 21. The emitter of transistor 47 is connected to the drain of an N-channel field effect transistor 49 and a resistor 55, and the collector of transistor 47 is connected to a terminal 71 which is adopted for receiving current from a voltage source. The gate of field effect transistor 49 is connected to the output of pulse inverter 15; and the source of field effect transistor 49 is connected to a capacitor 51.

Track and store circuit 19 comprises an NPN transistor 53, the base of which is connected to the output of track and store circuit 17. The emitter of transistor 53 is connected to the drain of an N-channel field effect transistor 59 and a resistor 57, and the collector of transistor 53 is effectively connected to terminal 71. The gate of field effect transistor 59 is connected to the second output of pulse amplifier 13; and the source of field effect transistor 59 is connected to a capacitor 63 and the base of an NPN transistor 61.

Voltage controlled current source 29 comprises a PNP transistor 65, with the base thereof connected to the output of frequency adjust circuit 27. The emitter of transistor 65 is connected to terminal 71, and the collector of transistor 65 is connected to capacitor 31.

Amplitude adjust circuit 25 includes a potentiometer 67, and frequency adjust circuit 27 includes a potentiometer 69.

At this time it is to be noted that all of the elements shown in FIGS. 1 and 2 which make up this invention are well known, conventional, and commercially available.

The operation of the invention will now be discussed in conjunction with all of the figures of the drawings.

Referring to FIGS. 1 and 2, input terminal 11 receives from the source of pulses, not shown, the sync pulse signal of FIG. 3(A). Each sync pulse of the sync pulse signal of FIG. 3(A) renders transistor 41 conductive for a time $t_1$ so that a trigger pulse signal having a plurality of trigger pulses, similar to that of FIG. 3(B), appears at the first and second outputs of pulse amplifier 13.

Similarly, each trigger pulse of the trigger pulse signal of FIG. 3(B) renders transistor 43 conductive for a time $t_2$ so that an inverted trigger pulse signal having a plurality of inverted trigger pulses, similar to that of FIG. 3(C), appears at the output of pulse inverter 15.

Voltage controlled current source 29 supplies an electric current to capacitor 31 at a predetermined rate, thereby charging capacitor 31. The rate at which capacitor 31 is charged is determined by a feedback control signal, not shown, provided by integrator 23, the details of which will be discussed below.

Clamp 21 discharges capacitor 31 on the trailing edge of each inverted trigger pulse of the inverted trigger pulse signal of FIG. 3(C), thereby causing a sawtooth waveform signal having a plurality of sawtooth waveforms, similar to that of FIG. 3(D), to appear at the first of the pair of outputs of clamp 21. The series combination of capacitor 73 and resistor 75 forms a differentiating circuit which provides a discharge pulse of short duration, not shown, in response to each of the inverted trigger pulses of the inverted trigger pulse signal of FIG. 3(C). Each discharge pulse, when supplied to the base of transistor 45, renders transistor 45 conductive so that capacitor 31 may discharge through transistor 45.

Track and hold circuit 17 tracks the sawtooth waveform signal of FIG. 3(D) and stores representations thereof such that a waveform signal, similar to that of FIG. 3(E), appears at the output of track and hold circuit 17. Each sawtooth waveform of the sawtooth waveform signal of FIG. 3(D) is supplied to the base of transistor 47 so as to control the current flow from terminal 71 through transistor 47 to the drain of field effect transistor 49. Each inverted trigger pulse of the inverted trigger pulse signal of FIG. 3(C), when applied to the gate of field effect transistor 49, renders field effect transistor 49 conductive for time $t_2$. This, in turn, allows capacitor 51 to charge during a time $t_3$ to a voltage potential 81, FIG. 3(E), which is equal to the maximum positive voltage of each sawtooth waveform of the sawtooth waveform signal of FIG. 3(D). Each inverted trigger pulse, FIG. 3(C), then renders field effect transistor 49 nonconductive for time $t_1$, so that voltage potential 81, FIG. 3(E), may be stored by capacitor 51 for time $t_1$. At this time it is to be noted that the input impedance of transistor 53 is very high so as to prevent capacitor 51 from discharging through transistor 53. Subsequently, capacitor 51 will discharge through field effect transistor 49 and resistor 55 when field effect transistor 49 is again rendered conductive by the inverted trigger pulse signal of FIG. 3(C).

Track and store circuit 19 samples the representations of the waveform signal of FIG. 3(E) stored by track and store circuit 17 and stores the sampled representations of the waveform signal of FIG. 3(E). The waveform signal of FIG. 3(E) is supplied to the base of transistor 53 so as to control the current flow from terminal 71 through transistor 53 to the drain of field effect transistor 59. Each trigger pulse of the trigger pulse signal of FIG. 3(B), when applied to the gate of field effect transistor 59, renders field effect transistor 59 conductive for time $t_1$. This, in turn, allows capacitor 63 to charge to a voltage potential 83, FIG. 3(F), which is equal to voltage potential 81, FIG. 3(E). Each trigger pulse, FIG. 3(B), then renders field effect transistor 59 nonconductive for time $t_2$ so that voltage potential 83 may be stored by capacitor 63 for time $t_2$. At this time it is to be noted that the input impedance of transistor 61 is very high so that the current discharged by capacitor 63 is very small during time $t_2$. This results in an amplitude error signal, similar to that of FIG. 3(F), being supplied to the first input of integrator 23 by track and store circuit 19.

Integrator 23 compares each voltage potential 83 of the amplitude error signal of FIG. 3(F) with a fixed amplitude signal, not shown, provided by potentiometer 67 so as to obtain and then integrate the difference between the amplitude error signal of FIG. 3(F) and the fixed amplitude signal. This results in a feedback control signal being provided by integrator 23 to the input of frequency adjust circuit 27. At this time it may be noted that the fixed amplitude signal provided by potentiometer 67 is the correct amplitude for the sawtooth waveform signal of FIG. 3(D).

Frequency range adjust circuit 27, which provides a means for controlling the range of pulse rates over which the sawtooth waveform signal of FIG. 3(D) is generated by the subject invention, then supplies the feedback control signal to the base of transistor 65 so as to control the current flow from terminal 71 through transistor 65 to capacitor 31, and thereby obtain a constant amplitude, which is independent of frequency, for the sawtooth waveform signal of FIG. 3(D). The sawtooth waveform signal of FIG. 3(D) is then supplied to the input of isolation amplifier 33, which acts as a buffer element for the sawtooth waveform signal of FIG. 3(D).

As an example of the operation of the subject invention, assume that voltage potential 83 of the amplitude error signal of FIG. 3(F) is lower than the correct amplitude as determined by the fixed amplitude signal provided by potentiometer 67. The algebraic sum of voltage potential 83, FIG. 3(F), and the fixed amplitude signal will be negative, thereby causing the feedback control signal provided by integrator 23 to increase at a rate which is proportional to the difference between voltage potential 83, FIG. 3(F), and the fixed amplitude signal. The feedback control signal will then increase the current flow through transistor 65 to capacitor 31 and thereby increase the slope of the ramp portion of the sawtooth waveform signal of FIG. 3(D) until voltage potential 83, FIG. 3(F), becomes equal to the fixed amplitude signal provided by potentiometer 67. The feedback control signal provided by integrator 23 is then held constant, thereby holding the amplitude of the sawtooth waveform signal of FIG. 3(D) constant.

From the foregoing, it may readily be seen that the subject invention comprises a new, unique, and exceedingly useful sawtooth waveform generator which constitutes a considerable improvement over the known prior art. Obviously, many modifications and variations of the present invention are possible in light of the above teachings. It is, therefore, to be understood that within the scope of the appended claims the invention may be practiced otherwise than as specifically described.

What is claimed is:

1. A constant amplitude, variable frequency, synchronized, linear ramp generator comprising in combination:
    trigger pulse source means having first and second outputs for providing a trigger pulse signal, and an inverted trigger pulse signal in response to a sync pulse signal;
    means for storing an electric current;
    current source means having an output effectively connected to said current storage means and an input for supplying said electric current to said current storage means at a predetermined rate;
    clamping means having an input connected to the second output of said trigger pulse source means, and a pair of outputs effectively connected across said current storage means for discharging, in response to the said inverted trigger pulse signal, said charge storage means, and thereby cause a sawtooth waveform signal having a plurality of sawtooth waveforms to appear at the first of the pair of outputs thereof;
    first monitoring means having a first input effectively connected to the first of the pair of outputs of said clamping means, a second input connected to the second output of said trigger pulse source means, and an output for tracking said sawtooth waveform signal and storing, in response to said inverted trigger pulse signal, representations of said tracked sawtooth waveform signal;
    second monitoring means, having a first input connected to the output of said first monitoring means, a second input connected to the first output of said trigger pulse source means, and an output for sampling the representations of said sawtooth waveform signal stored by said first monitoring means and storing, in response to said trigger pulse signal, the sampled representations of said sawtooth waveform signal; and
    integrating means having an input connected to the output of said second monitoring means and an output effectively connected to the input of said current source means for providing a feedback control signal in response to the sampled representations of said sawtooth waveform signal stored by said second monitoring means, said feedback control signal to control the rate at which said current source means supplies charge to said current storage means.

2. The constant amplitude, variable frequency, synchronized, linear ramp generator of claim 1, further characterized by an isolation amplifier having an input connected to the first of the pair of outputs of said clamping means.

3. The constant amplitude, variable frequency, synchronized, linear ramp generator of claim 1, wherein said trigger pulse source means comprises:
    an input terminal for connection to a source of pulses;
    a pulse amplifier having an input effectively connected to said input terminal, and an output; and
    a pulse inverter having an input connected to the output of said pulse amplifier.

4. The constant amplitude, variable frequency, synchronized, linear ramp generator of claim 1, wherein said means for storing an electric current is a capacitor.

5. The constant amplitude, variable frequency, synchronized, linear ramp generator of claim 1, wherein said first monitoring means comprises:
    an N-channel field effect transistor having a drain effectively connected to the first of the pair of outputs of said clamping means, a gate connected to the second output of said trigger pulse source means, and a source; and
    a capacitor effectively connected to the source of said N-channel field effect transistor.

6. The constant amplitude, variable frequency, synchronized, linear ramp generator of claim 1, wherein said second monitoring means comprises:
    an N-channel field effect transistor having a drain effectively connected to the output of said first monitoring means, a gate connected to the first output of said trigger pulse source means, and a source; and
    a capacitor effectively connected to the source of said N-channel field effect transistor.

7. The constant amplitude, variable frequency, synchronized, linear ramp generator of claim 1, wherein said integrating means comprises:
    an integrator having a first input connected to the output of said second monitoring means, a second input, and an output;
    an amplitude adjust circuit having an output connected to the second input of said integrator; and
    a frequency range adjust circuit having an input connected to the output of said integrator.

8. The constant amplitude, variable frequency, synchronized, linear ramp generator of claim 7, wherein said amplitude adjust and frequency range adjust circuits are potentiometers.

9. A sawtooth waveform generator comprising in combination:
    an input terminal for connection to a source of pulses;
    a pulse amplifier having an input effectively connected to said input terminal, a first output, and a second output;
    a pulse inverter having an input connected to the first output of said pulse amplifier and an output;
    a first track and store circuit having a first input connected to the output of said pulse inverter, a second input and an output;
    a second track and store circuit having a first input connected to the output of said first track and store circuit, a second input connected to the second output of said pulse amplifier and an output;
    an integrator having a first input connected to the output of said second track and store circuit, a second input, and an output;
    an amplitude adjust circuit having an output connected to the second input of said integrator;

a frequency range adjust circuit having an input connected to the output of said integrator and an output;

a voltage controlled current source having an input connected to the output of said frequency range adjust circuit and an output connected to the second input of said first track and store circuit;

a clamp having an input connected to the output of said pulse inverter, a first output connected to the second input of said first track and store circuit, and a second output; and a capacitor effectively connected between the first and second outputs of said clamp.

10. The sawtooth waveform generator according to claim 9, further characterized by an isolation amplifier having an input connected to the output of said voltage controlled current source.

11. The sawtooth waveform generator according to claim 9, wherein said first track and store circuit comprises:

an N-channel field effect transistor having a drain effectively connected to the output of said voltage controlled current source, a gate connected to the output of said pulse inverter, and a source; and a capacitor effectively connected to the source of said N-channel field effect transistor.

12. The sawtooth waveform generator according to claim 9, wherein said second track and store circuit comprises:

an N-channel field effect transistor having a drain effectively connected to the output of said first track and store circuit, a gate connected to the second output of said pulse amplifier, and a source; and a capacitor effectively connected to the output of said N-channel field effect transistor.

13. The sawtooth waveform generator according to claim 9, wherein said amplitude adjust and frequency range adjust circuits are potentiometers.

* * * * *